United States Patent
Mori et al.

(10) Patent No.: US 11,789,063 B2
(45) Date of Patent: Oct. 17, 2023

(54) CONDUCTION INSPECTION JIG, AND INSPECTION METHOD OF PRINTED WIRING BOARD

(71) Applicant: IBIDEN CO., LTD., Gifu (JP)

(72) Inventors: Takayuki Mori, Ogaki (JP); Taishi Takeda, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 0 days.

(21) Appl. No.: 17/488,353

(22) Filed: Sep. 29, 2021

(65) Prior Publication Data
US 2022/0099727 A1    Mar. 31, 2022

(30) Foreign Application Priority Data

Sep. 30, 2020  (JP) ................................ 2020-165099
Sep. 14, 2021  (JP) ................................ 2021-149279

(51) Int. Cl.
| | | |
|---|---|---|
| *G01R 31/27* | (2006.01) | |
| *G01R 31/28* | (2006.01) | |
| *G01R 1/02* | (2006.01) | |
| *G01R 1/04* | (2006.01) | |
| *G01R 1/067* | (2006.01) | |
| *G01R 1/073* | (2006.01) | |
| *G01R 1/20* | (2006.01) | |

(52) U.S. Cl.
CPC ....... *G01R 31/2808* (2013.01); *G01R 1/0416* (2013.01)

(58) Field of Classification Search
CPC .......... G01R 31/27; G01R 31/28; G01R 1/04; G01R 1/067; G01R 1/073; G01R 1/02; G01R 1/20
See application file for complete search history.

(56) References Cited

U.S. PATENT DOCUMENTS

| | | | | |
|---|---|---|---|---|
| 7,601,009 | B2 * | 10/2009 | Di Stefano | ........ G01R 1/06738 439/73 |
| 11,035,883 | B2 * | 6/2021 | Mochizuki | ........... G01R 1/0416 |
| 2020/0166564 | A1 * | 5/2020 | Takano | .............. G01R 31/2808 |
| 2022/0146553 | A1 * | 5/2022 | Hayashizaki | ...... G01R 1/06755 |

FOREIGN PATENT DOCUMENTS

| | | | |
|---|---|---|---|
| JP | 2007-309648 A | 11/2007 | |
| KR | 20180029523 | * 3/2018 | ............. G01R 1/067 |

* cited by examiner

*Primary Examiner* — Neel D Shah
(74) *Attorney, Agent, or Firm* — Oblon, McClelland, Maier & Neustadt, L.L.P.

(57) ABSTRACT

A conduction inspection jig includes a first member having first openings, a second member having second openings and formed to be positioned above the first member, a third member formed to be positioned between the first member and the second member such that the third member forms a space between the first member and the second member and at least substantially surrounds the space, and a probe formed to pass through one of the first openings and one of the second openings such that the probe extends through the space formed between the first member and the second member.

20 Claims, 7 Drawing Sheets

CONDUCTION INSPECTION JIG, AND INSPECTION METHOD OF PRINTED WIRING BOARD

CROSS-REFERENCE TO RELATED APPLICATIONS

The present application is based upon and claims the benefit of priority to Japanese Patent Applications No. 2020-165099, filed Sep. 30, 2020 and No. 2021-149279, filed Sep. 14, 2021. The entire contents of these applications are incorporated herein by reference.

BACKGROUND OF THE INVENTION

Field of the Invention

The present invention relates to a conduction inspection jig, and relates to an inspection method of the printed wiring board.

Description of Background Art

Japanese Patent Application Laid-Open Publication No. 2007-309648 describes a substrate inspection jig. The entire contents of this publication are incorporated herein by reference.

SUMMARY OF THE INVENTION

According to one aspect of the present invention, a conduction inspection jig includes a first member having first openings, a second member having second openings and formed to be positioned above the first member, a third member formed to be positioned between the first member and the second member such that the third member forms a space between the first member and the second member and at least substantially surrounds the space, and a probe formed to pass through one of the first openings and one of the second openings such that the probe extends through the space formed between the first member and the second member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
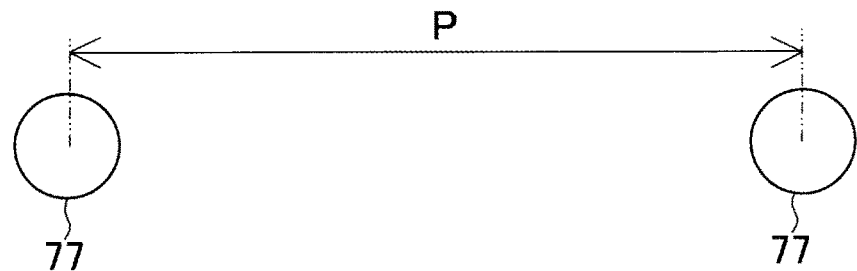
FIG. 1A is a plan view of electrodes.

Embodiments will now be described with reference to the accompanying drawings, wherein like reference numerals designate corresponding or identical elements throughout the various drawings.

Figure 2:
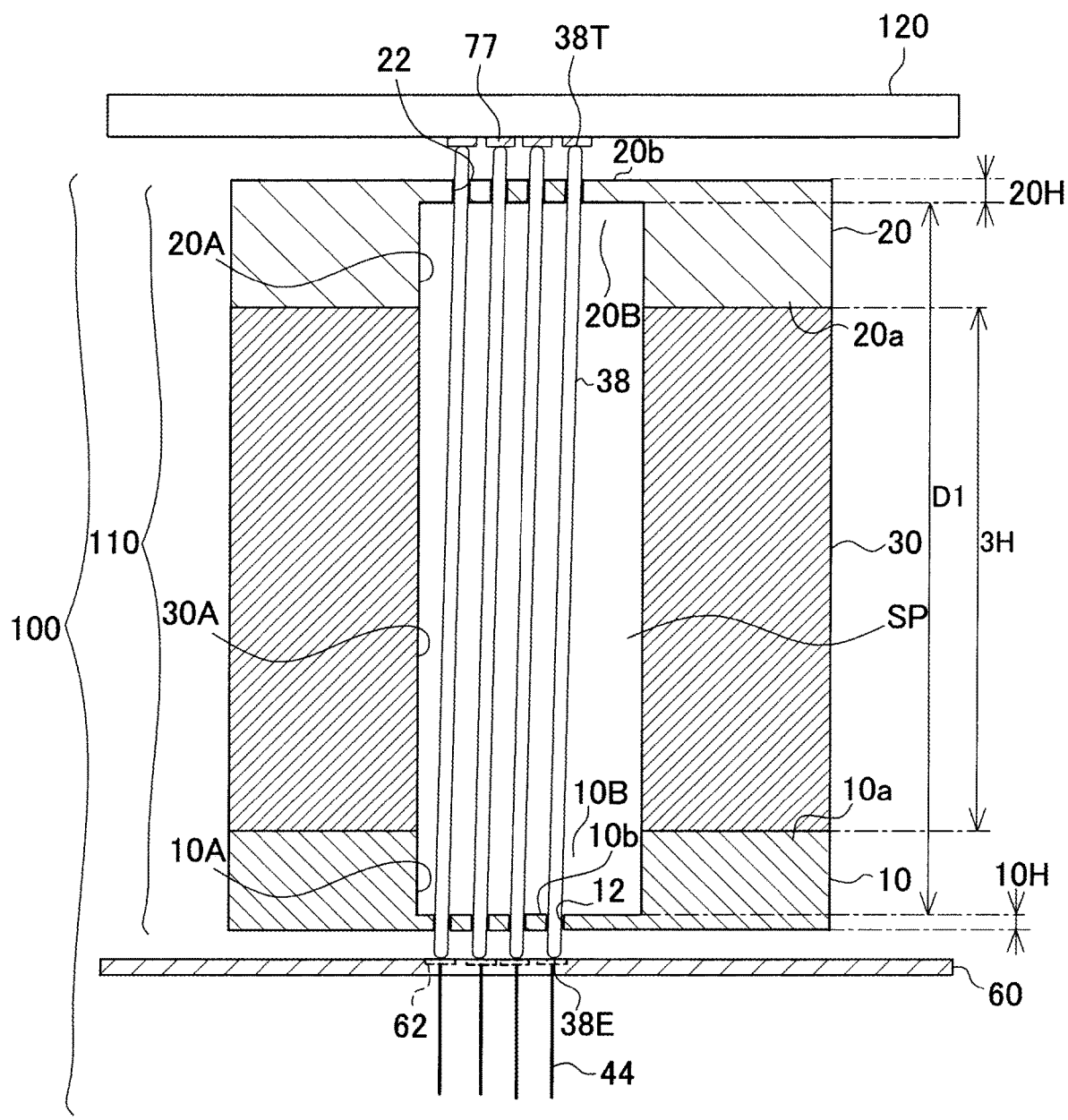
FIG. 2 illustrates an inspection device and a printed wiring board.

FIG. 2 illustrates an inspection device 100 of an embodiment and a printed wiring board 120 to be inspected. The inspection device 100 performs electrical inspection of the printed wiring board 120, which has wirings. The inspection device 100 has a conduction inspection jig 110. The conduction inspection jig 110 is formed to include: a first member 10; a second member 20 positioned above the first member 10; a third member 30 positioned between the first member 10 and the second member 20, and probes 38 that penetrate the second member 20, the third member 30 and the first member 10. The number of the probes 38 is 2 or more. The inspection device 100 further has a substrate 60, which has terminals 62 below the first member 10, and lead wires 44, which respectively extend from the terminals 62. The lead wires 44 are electrically connected to a tester (not illustrated in the drawings).

Figure 1B:
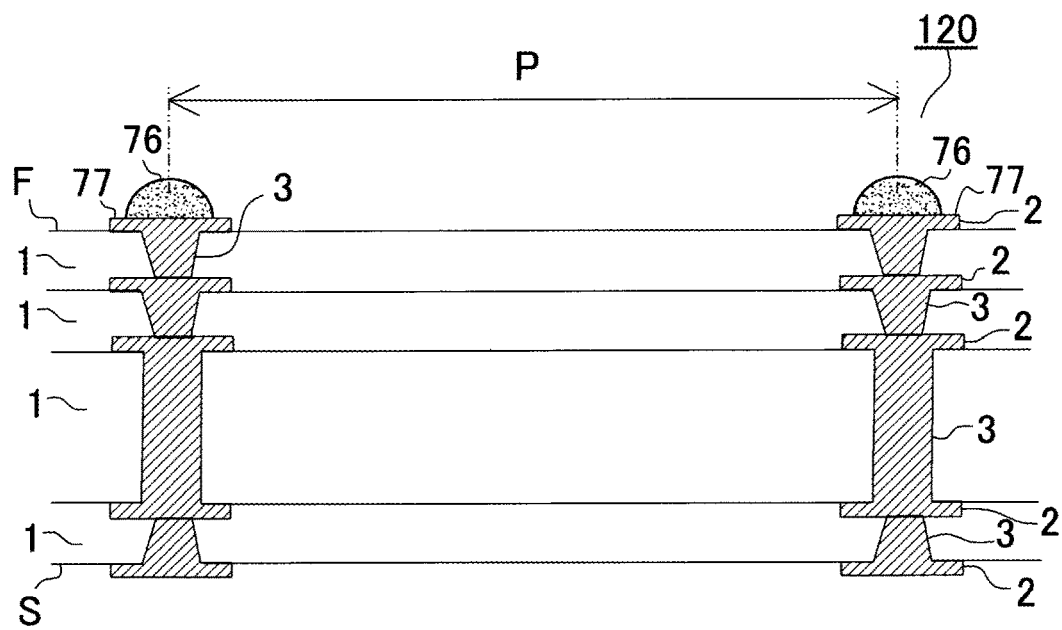
FIG. 1B is a cross-sectional view of a printed wiring board.

FIG. 1B illustrates an example of the printed wiring board 120 to be inspected. FIG. 1B illustrates a cross section of the printed wiring board 120. The printed wiring board 120 includes multiple resin insulating layers 1 and multiple conductor layers 2. The resin insulating layers 1 and the conductor layers 2 are alternately laminated. Adjacent conductor layers 2 are connected by via conductors 3. The printed wiring board 120 has a front surface (F) and a back surface (S) on the opposite side with respect to the front surface (F). There are multiple electrodes 77 on the front surface (F). FIG. 1A is a plan view of the electrodes 77. Two adjacent electrodes 77 are depicted in FIG. 1A. A pitch (P) between adjacent electrodes 77 is illustrated in FIGS. 1A and 1B. The pitch (P) is a distance between centers of adjacent electrodes 77.

As illustrated in FIG. 2, the probes 38 each have a one-end (38T) and the other end (38E) on the opposite side with respect to the one-end (38T). The one-ends (38T) protrude from the second member 20. The other-ends (38E) protrude from the first member 10. Then, as illustrated in FIG. 2, during inspection, the one-ends (38T) of the probes 38 are electrically connected to the electrodes 77 of the printed wiring board 120. As illustrated in FIG. 1B, when the printed wiring board 120 has bumps 76 on the electrodes 77, the one-ends (38T) are in contact with the bumps 76. During inspection, the other-ends (38E) of the probes 38 are connected to the terminals 62.

The probes 38 are each formed of a conductive wire and an insulating film that covers a side surface of the wire. The probes 38 are flexible.

As illustrated in FIG. 2, the first member 10 has multiple first openings 12. The second member 20 has multiple second openings 22. The third member 30 is positioned between the first member 10 and the second member 20 such that a space (SP) is formed between the first member 10 and the second member 20. There is one space (SP). The third member 30 controls a distance (D1) of the space (SP). The distance (D1) is substantially controlled by a thickness (3H) of the third member 30. The thickness (3H) of the third member 30 is 1.5 mm or more and 10 mm or less. The thickness (3H) is preferably 1.5 mm or more and 2.5 mm or less. A small conduction inspection jig 110 can be provided. The probes 38 each pass through one of the first openings 12, the space (SP), and one of the second openings 22. The probes 38 are all accommodated in the space (SP).

In the embodiment, the third member 30 that substantially surrounds the space (SP) is positioned between the first member 10 and the second member 20. A contact area between the first member 10 and the third member 30 is a first area. A contact area between the second member 20 and the third member 30 is a second area.

Figure 1C:
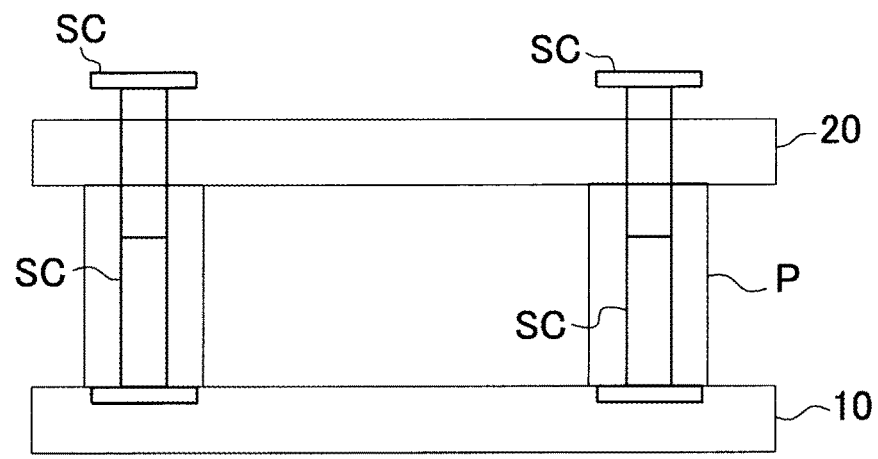
FIG. 1C is a cross-sectional view of a conduction inspection jig of a reference example.

A conduction inspection jig of a reference example is illustrated in FIG. 1C. In the reference example, a supporting post (P) is positioned between the first member 10 and the second member 20. A contact area between the first member 10 and the supporting post (P) is a third area. A contact area between the second member 20 and the supporting post (P) is a fourth area.

The third member 30 substantially surrounds the space (SP). Therefore, when the first area and the third area are compared, the first area is larger than the third area. When the second area and the fourth area are compared, the second area is larger than the fourth area. By using the third member 30, the contact area between the first member 10 and the third member 30 can be increased. The contact area between the second member 20 and the third member 30 can be increased. By using the third member 30, the distance (D1) of the space (SP) can be controlled with high accuracy. For example, deformation of the first member 10 and the second member 20 can be suppressed. Thicknesses of the first member 10 and the second member 20 can be reduced. By reducing the thickness of the first member 10, diameters of the first openings 12 formed in the first member 10 can be reduced. By reducing the thickness of the second member 20, diameters of the second openings 22 formed in the second member 20 can be reduced. The conduction inspection jig 110 can have more probes 38. A distance between adjacent first openings 12 can be reduced. A distance between adjacent second openings 22 can be reduced. By using the conduction inspection jig 110 of the embodiment, a high-density printed wiring board 120 can be inspected. For example, even when the pitch (P) between adjacent electrodes 77 is 55 µm or less, conduction inspection can be performed with high accuracy by using the conduction inspection jig 110 of the embodiment. When the pitch (P) between adjacent electrodes 77 is 25 µm or more, conduction inspection can be performed using the conduction inspection jig 110 of the embodiment.

Figure 3A:
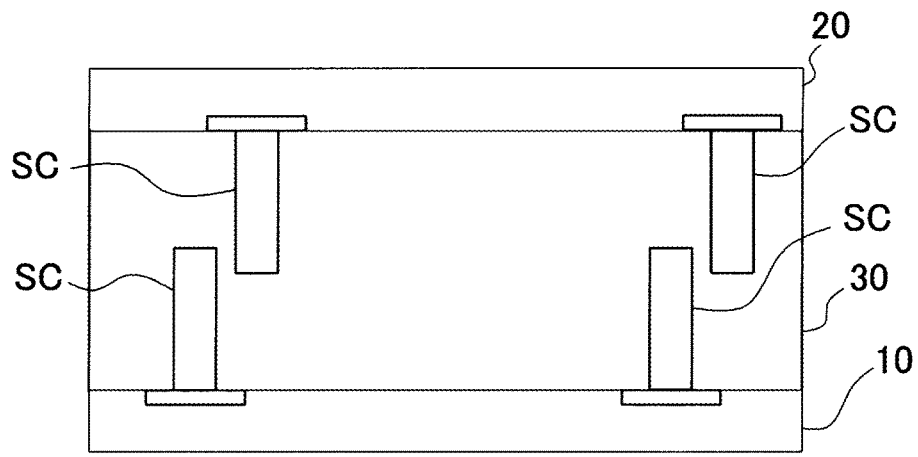
FIG. 3A illustrates a conduction inspection jig of an embodiment.

As illustrated in FIG. 3A, in the embodiment, the first member 10 and the third member 30 can be fixed to each other using screws (SC). The second member 20 and the third member 30 can be fixed to each other using screws (SC). As illustrated in FIG. 1C, in the reference example, the first member 10 and the supporting post (P) can be fixed to each other using screws (SC). The second member 20 and the supporting post (P) can be fixed to each other using screws (SC). The screws (SC) used in the examples of FIGS. 3A and 1C are the same. In FIG. 1C, the screws (SC) that fix the first member 10 and the support (P) to each other collide with the screws (SC) that fix the second member 20 and the support (P) to each other. Therefore, for the fixing, the supporting post (P) is lengthened. In contrast, in FIG. 3A, positions of the screws (SC) that fix the first member 10 and the third member 30 to each other can be shifted from positions of the screws (SC) that fixes the second member 20 and the third member 30 to each other. Therefore, even when the third member 30 is thin, the first member 10 and the third member 30 can be fixed to each other. The second member 20 and the third member 30 can be fixed to each other. According to the embodiment, the third member 30 can be reduced in thickness. Therefore, the conduction inspection jig 110 can be reduced in size.

The third member 30 substantially surrounds the space (SP). Therefore, a foreign matter cannot enter the space (SP) from outside. Or, the number of foreign matters that enter the space (SP) from outside can be reduced. Therefore, even when the probes 38 are densely positioned, the probes 38 can be aligned in the space (SP) during inspection. A high density printed wiring board 120 can be inspected. Even when the pitch (P) between adjacent electrodes 77 is 25 µm or more and 45 µm or less, conduction inspection can be performed with high accuracy by using the conduction inspection jig 110 of the embodiment.

Figure 3B:
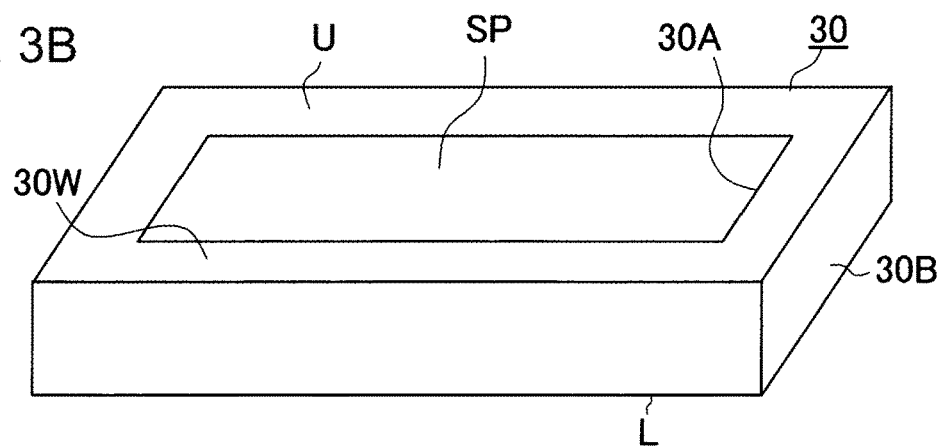
FIG. 3B is a perspective view of a first example of a third member according to an embodiment of the present invention.
Figure 3C:
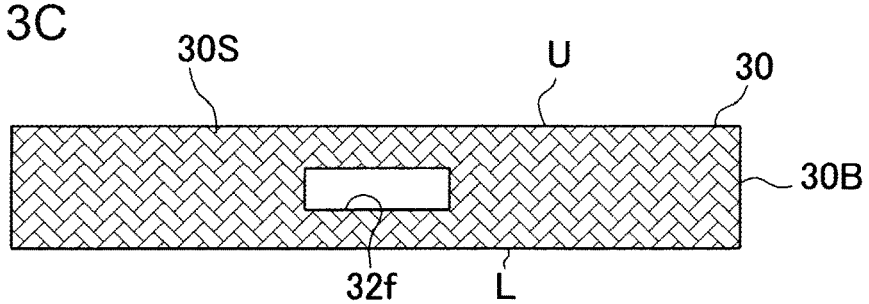
FIG. 3C illustrates an outer wall of a second example of the third member according to an embodiment of the present invention.
Figure 3D:
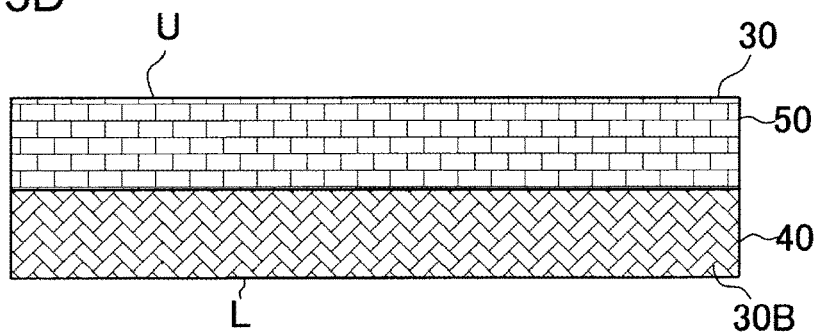
FIG. 3D illustrates an outer wall of a third example of the third member according to an embodiment of the present invention.
Figure 4A:
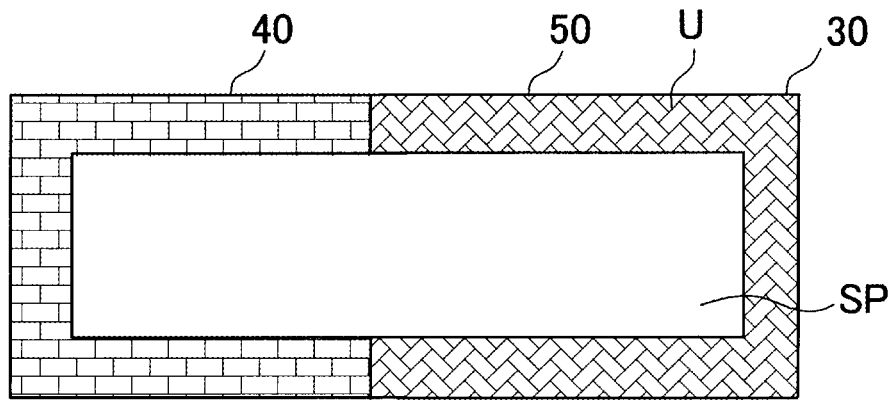
FIG. 4A illustrates an upper surface of a fourth example of the third member according to an embodiment of the present invention.
Figure 4B:
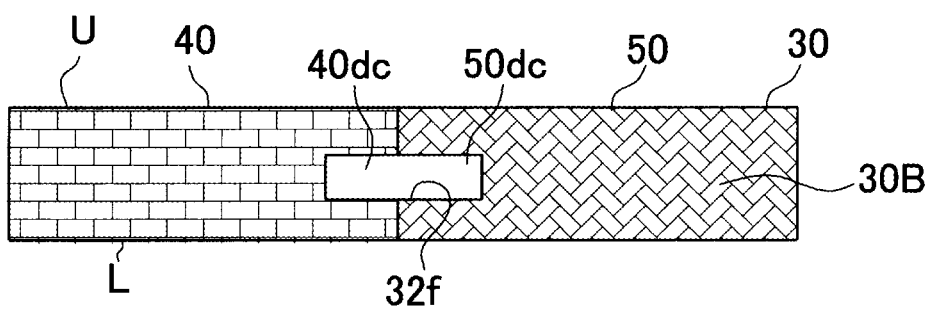
FIG. 4B illustrates an outer wall of a fifth example of the third member according to an embodiment of the present invention.
Figure 4C:
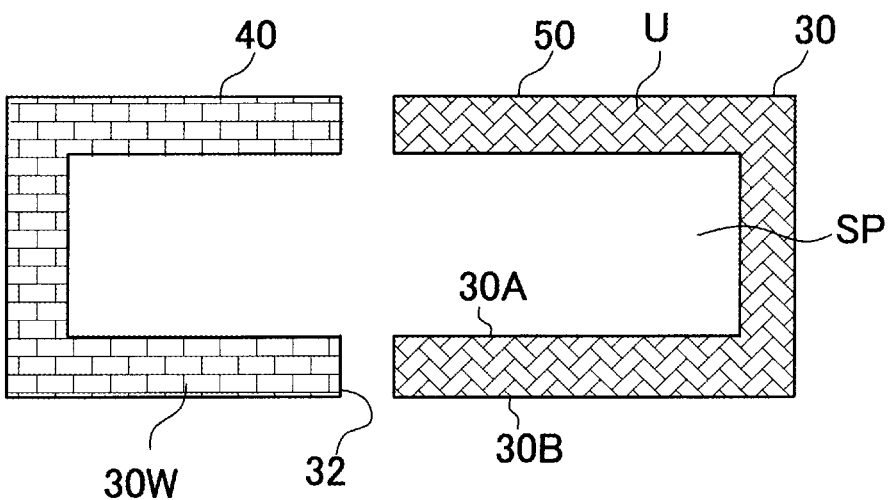
FIG. 4C illustrates an upper surface of a sixth example of the third member according to an embodiment of the present invention.

Next, examples of the third member 30 are illustrated. FIG. 3B is the first example, FIG. 3C is a second example, FIG. 3D is a third example, FIG. 4A is a fourth example, FIG. 4B is a fifth example, and FIG. 4C is a sixth example.

The third member 30 has an inner wall (30A) facing the space (SP) and an outer wall (30B) on the opposite side with respect to the inner wall (30A). The outer wall (30B) faces outside. A member formed between the inner wall (30A) and the outer wall (30B) is a side wall (30W). The third member 30 has an upper surface (U) and a lower surface (L) on the opposite side with respect to the upper surface (U). The upper surface (U) is close to the second member 20. The lower surface (L) is close to the first member 10. The upper surface (U) and the lower surface (L) are illustrated, for example, in FIGS. 3B and 3C.

In the first and second examples, the third member 30 is formed of one member. The upper surface (U) in the first and second examples is continuous. The lower surface (L) in the first and second examples is continuous.

In the third, fourth, fifth, and sixth examples, the third member 30 is formed of multiple members (40, 50).

In the third example, the third member 30 is formed by laminating multiple members (40, 50). The members (40, 50) each have a frame-like shape.

In the fourth, fifth, and sixth examples, the third member 30 is formed by combining multiple members (40, 50). The members (40, 50) do not each have a frame-like shape.

In the third example, the members (40, 50) are vertically positioned. In the fourth, fifth and sixth examples, the members (40, 50) are horizontally positioned.

In the first example, the second example, the third example, the fourth example, the fifth example and the sixth example, the third member 30 has a substantially frame-like planar shape. The planar shape is represented by a shape of the upper surface (U). Or, the planar shape is represented by a shape of the lower surface (L).

In the first example, the second example, the third example, the fourth example and the fifth example, the upper surface (U) and the lower surface (L) are connected. In these examples, the upper surface (U) has a perfect frame shape. The lower surface (L) has a perfect frame shape.

The upper surface (U) in the sixth example is not connected. The lower surface (L) in the sixth example is not connected. In the sixth example, a gap 32 is formed between the one member 40 and the member 50 positioned adjacent to the member 40.

A perspective view of the first example of the third member 30 is illustrated in FIG. 3B. In the first example, the third member 30 does not have an opening or a gap extending from the inner wall (30A) to the outer wall (30B). In the first example, the space (SP) surrounded by the third member 30 is completely surrounded by the third member 30. The third member 30 completely surrounds the space (SP) in the third member 30.

FIG. 3C illustrates the one outer wall (30B) of the second example of the third member 30. As illustrated in FIG. 3C, the second example of the third member 30 has openings (32f). The openings (32f) each extend from the inner wall (30A) to the outer wall (30B). The openings (32f) connect the space (SP) to the outside. The openings (32f) are not connected to the upper surface (U). Further, the openings (32f) are not connected to the lower surface (L). The number of the openings (32f) is 2 or more. One opening (32f) is formed on each side surface (30S) of the third member 30. The side surfaces (30S) form the outer wall (30B). In the second example, the space (SP) surrounded by the third member 30 is substantially surrounded by the third member 30. The third member 30 substantially surrounds the space (SP) in the third member 30.

FIG. 3D illustrates one outer wall (30B) of the third example of the third member 30. The third example of the third member 30 is formed of the fourth member 40 and the fifth member 50. The fifth member 50 is laminated on the fourth member 40. Among the fourth member 40 and the fifth member 50, the fourth member 40 is close to the first member 10. The fourth member 40 and the fifth member 50 have the same shape. The way to surround the space (SP) of the third example and the way to surround the space (SP) of the first example are the same.

FIG. 4A illustrates the upper surface (U) of the fourth example of the third member 30. In the fourth example, the third member 30 is formed by combining multiple members (40, 50). The space (SP) surrounded by the third member 30 is completely surrounded by the third member 30. In FIG. 4A, the fifth member 50 is positioned horizontally adjacent to the fourth member 40. The fourth member 40 and the fifth member 50 are in contact with each other.

FIG. 4B illustrates one outer wall (30B) of the fifth example of the third member 30. In the fifth example, the third member 30 having an opening (32f) is formed by combining multiple members (40, 50). For example, the opening (32f) is formed by connecting the two members (40, 50). The opening (32f) is formed at a boundary between the two members (40, 50). In FIG. 4B, the third member 30 is formed of the fourth member 40 and the fifth member 50 such that the opening (32f) is formed. The opening (32f) is formed at a boundary between the fourth member 40 and the fifth member 50. The fourth member 40 and the fifth member 50 respectively have recesses (40dc, 50dc). The opening (32f) is formed by connecting the recess (40dc) of the fourth member 40 and the recess (50dc) of the fifth member 50. The opening (32f) of the fifth example and the opening (32f) of the second example are similar to each other. The way to surround the space (SP) of the fifth example and the way to surround the space (SP) of the second example are the same.

Figure 6A:
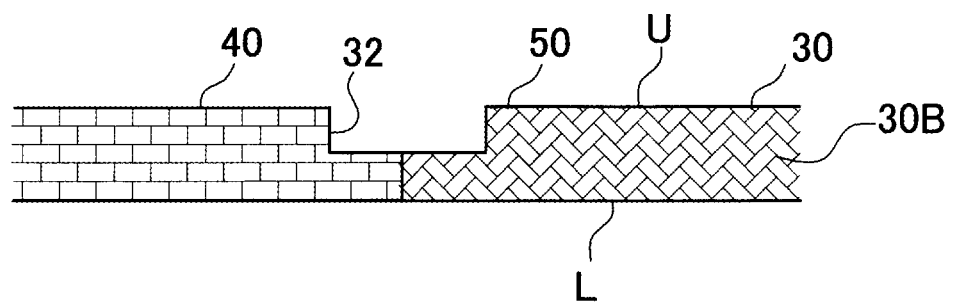
FIGS. 6A and 6B illustrate examples of gaps according to an embodiment of the present invention.
Figure 6B:
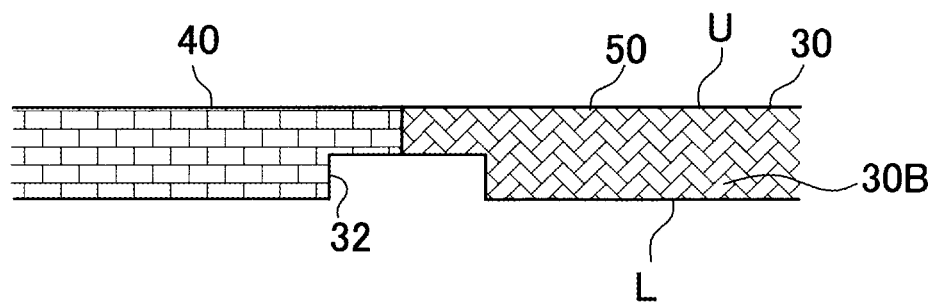

FIG. 4C illustrates the upper surface (U) of the sixth example of the third member 30. The sixth example of the third member 30 has a gap 32 connecting the space (SP) to outside. In the example of FIG. 4C, the third member 30 is formed of the fourth member 40 and the fifth member 50 such that the gap 32 connecting the space (SP) to the outside is formed between the fourth member 40 and the fifth member 50. In FIG. 4C, the gap 32 extends from the inner wall (30A) to the outer wall (30B). The gap 32 penetrates the side wall (30W). Further, the gap 32 extends from the upper surface (U) to the lower surface (L). Another example of the gap 32 is illustrated in FIG. 6A. In the example of FIG. 6A, the gap 32 does not extend from the upper surface (U) to the lower surface (L). The gap 32 extends from the inner wall (30A) to the outer wall (30B). The gap 32 extends from the upper surface (U) to a predetermined position between the upper surface (U) and the lower surface (L). Or, as illustrated in FIG. 6B, the gap 32 extends from the lower surface (L) to a predetermined position between the upper surface (U) and the lower surface (L). In the sixth example, the space (SP) surrounded by the third member 30 is substantially surrounded by the third member 30. The third member 30 substantially surrounds the space (SP) in the third member 30.

Figure 7A:
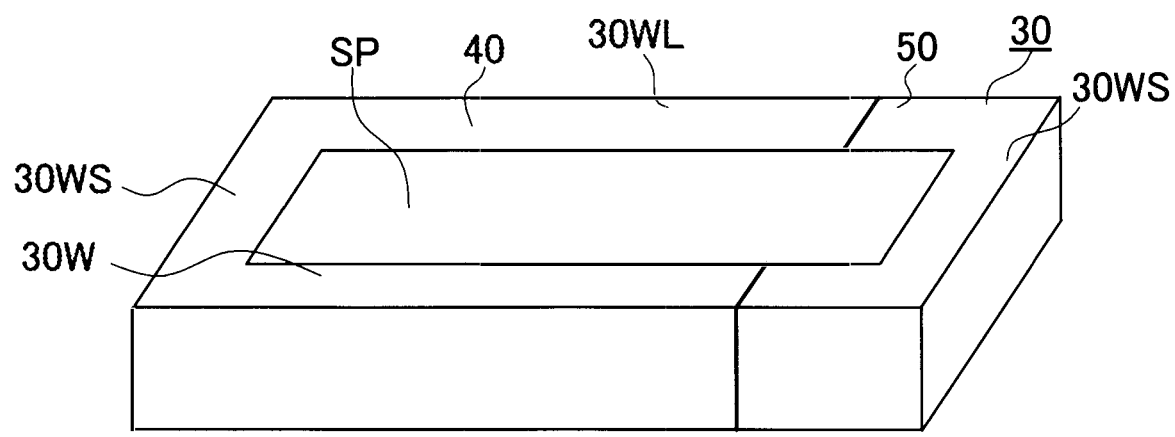
FIG. 7A is a perspective view of a seventh example of the third member according to an embodiment of the present invention.
Figure 7B:
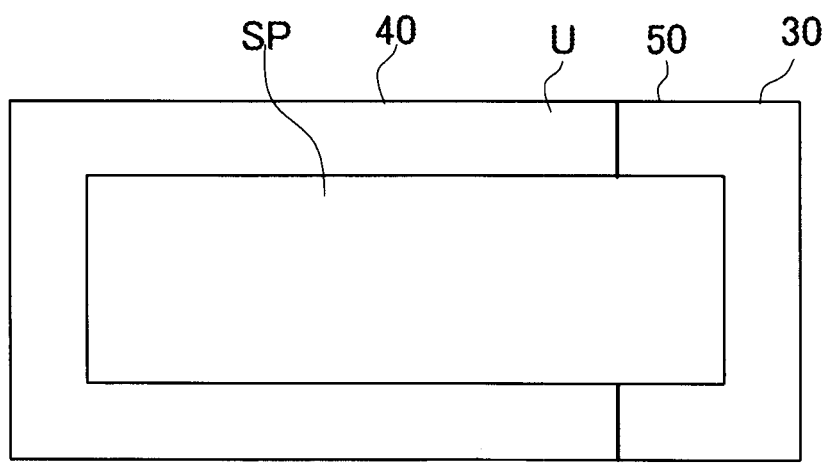
FIG. 7B illustrates an upper surface of the seventh example of the third member according to an embodiment of the present invention.

A perspective view of a seventh example of the third member 30 is illustrated in FIG. 7A. An upper surface (U) of the seventh example of the third member is illustrated in FIG. 7B. In the seventh example, the third member 30 is formed by combining multiple members (40, 50). The space (SP) surrounded by the third member 30 is completely surrounded by the third member 30. In the seventh example, the fifth member 50 is positioned adjacent to the fourth member 40. The fourth member 40 and the fifth member 50 are in contact with each other. As illustrated in FIGS. 7A and 7B, the fourth member 40 and the fifth member 50 are different in size. The fourth member 40 is larger than the fifth member 50. As illustrated in FIG. 7A, the third member of the seventh example has a long side wall (30WL) and a short side wall (30WS). The short side wall (30WS) forming the fourth member 40 and the short side wall (30WS) forming the fifth member 50 have the same size. The long side wall (30WL) forming the third member 30 is formed by a side wall (30W) of the fourth member 40 and a side wall (30W) of the fifth member 50. And, the side wall (30W) of the fourth member 40 and the side wall (30W) of the fifth member 50 are different in size. The long side wall (30WL) forming the third member is formed of side walls (30W) of different sizes. The side wall (30W) of the fourth member 40 forming the long side wall (30WL) is larger than the side wall (30W) of the fifth member 50 forming the long side wall (30WL).

The third member 30 supports the first member 10 and the second member 20. When the third member 30 completely surrounds the space (SP), a portion that supports the first member 10 can be increased. A portion that supports the second member 20 can be increased. A deformation amount of the first member 10 can be reduced. A deformation amount of the second member 20 can be reduced. The distance (D1) of the space (SP) can be controlled.

When the third member 30 has the opening (32f) or the gap 32, the inside of the space (SP) can be observed. Whether or not the probes 38 pass through the first openings 12 appropriately can be confirmed via the opening (32f) or the gap 32. Similarly, whether or not the probes 38 pass through the second openings 22 appropriately can be confirmed. Whether or not the probes 38 are appropriately positioned in the space (SP) can be confirmed.

In the fourth, fifth, sixth, and seventh examples, the members (40, 50) are horizontally positioned. Therefore, the members (40, 50) that form the third member 30 each have a size smaller than that of the third member 30. When the members (40, 50) are processed, a strain is small. By combining the members (40, 50) having a smaller strain, the third member 30 is manufactured. Therefore, in the fourth, fifth, sixth, and seventh examples, the third member 30 is unlikely to deform during use.

Figure 6C:
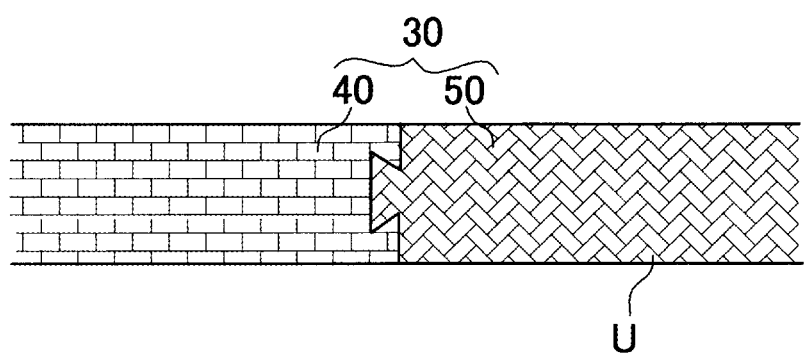
FIG. 6C illustrates an example of how members are assembled according to an embodiment of the present invention.

As illustrated in FIG. 6C, when the third member 30 is formed of multiple members (40, 50), the third member 30 can be formed by fitting the fifth member 50 to the fourth member 40.

The third member 30 is preferably formed of a resin material. When the third member 30 is formed of multiple members (40, 50), the members (40, 50) are each formed of a resin material. The fourth member 40 and the fifth member 50 are each formed of a resin material.

As illustrated in FIG. 2, the first member 10 is formed to include a first recess (10B), a frame (10a) surrounding the first recess (10B), and a sheet (10b) covering the first recess (10B) and the frame (10a). Since the first member 10 has the first recess (10B), the sheet (10b) on the first recess (10B) can be reduced in thickness. The first openings 12 are formed in the sheet (10b) on the first recess (10B). The first openings 12 penetrate the sheet (10b) on the first recess (10B). The first openings 12 can be reduced in diameter. The first openings 12 can be formed at a high density.

The frame (10a) and the sheet (10b) are integrally formed. Or, the frame (10a) and the sheet (10b) are separately formed. The former is a first example of the first member 10, and the latter is a second example of the first member 10. In the first example, the first member 10 having the first recess (10B) is formed by removing a center portion of the one sheet (10b). Therefore, the sheet (10b) and the frame (10a) are continuous. The frame (10a) extends from the sheet (10b). In the second example, one sheet (10b) and one frame (10a) are prepared. The one frame (10a) is laminated on the one sheet (10b). The first example is excellent in terms of strength. The second example is excellent in terms of processing of the first openings 12.

The first recess (10B) is connected to the space (SP) surrounded by the third member 30. The first recess (10B) forms a part of the space (SP). Therefore, even when the third member 30 is thin, the distance (D1) of the space (SP) can be secured.

The frame (10a) forming the first member 10 has the same planar shape as the third member 30. The sheet (10b) is rigid.

The second member 20 is formed to include a second recess (20B), a frame (20a) surrounding the second recess (20B), and a sheet (20b) covering the second recess (20B) and the frame (20a). Since the second member 20 has the second recess (20B), the sheet (20b) on the second recess (20B) can be reduced in thickness. The second openings 22 are formed in the sheet (20b) on the second recess (20B). The second openings 22 penetrate the sheet (20b) on the second recess (20B). The second openings 22 can be reduced in diameter. The second openings 22 can be formed at a high density.

The frame (20a) and the sheet (20b) are integrally formed. Or, the frame (20a) and the sheet (20b) are separately formed. The former is a first example of the second member 20, and the latter is a second example of the second member 20. In the first example, the second member 20 having the second recess (20B) is formed by removing a center portion of the one sheet (20b). Therefore, the sheet (20b) and the frame (20a) are continuous. The frame (20a) extends from the sheet (20b). In the second example, one sheet (20b) and one frame (20a) are prepared. The one frame (20a) is laminated on the one sheet (20b). The first example is excellent in terms of strength. The second example is excellent in terms of processing of the second openings 22.

The second recess (20B) is connected to the space (SP) surrounded by the third member 30. The second recess (20B) forms a part of the space (SP). Therefore, even when the third member 30 is thin, the distance (D1) of the space (SP) can be secured.

The frame (20a) forming the second member 20 has the same planar shape as the third member 30. The sheet (10b) is rigid.

A thickness (10H) of the sheet (10b) and a thickness (20H) of the sheet (20b) are each 0.15 mm or more and 0.35 mm or less. Even when the pitch (P) is 55 µm or less, the first openings 12 can be formed in the sheet (10b). The second openings 22 can be formed in the sheet (20b).

The thickness (10H) of the sheet (10b) and the thickness (20H) of the sheet (20b) are each 0.15 mm or more and 0.25 mm or less. Even when the pitch (P) is 45 µm or less, the first openings 12 can be formed in the sheet (10b). The second openings 22 can be formed in the sheet (20b).

As illustrated in FIG. 2, one probe passes through one first opening 12 and one second opening 22. The second openings 22 are not respectively directly positioned above the first openings 12. The first openings 12 and the second openings 22 are formed such that the probes 38 are obliquely positioned. The probes 38 are inclined in the same way. During inspection, the one-ends (38T) are in contact with the electrodes 77 or the bumps 76 of the printed wiring board 120, and the other-ends (38E) are in contact with the terminals 62. In this case, since the probes 38 are similarly inclined, the probes 38 bend in the same direction. All the probes 38 bend in the same direction in the space (SP).

The distance (D1) of the space (SP) is 3.5 mm or more and 12 mm or less. The probes 38 appropriately pass through the first openings 12 and the second openings 22. When the pitch (P) becomes smaller, the probes 38 are formed thinner. As the probes 38 become thinner, the probes 38 are reduced in strength. When the probes 38 are reduced in strength and are long, the probes 38 are entangled in the space (SP). However, even when the pitch (P) is 25 µm or more and 45 µm, when the distance (D1) is 6 mm or more and 10 mm or less, the probes 38 having appropriate strength and appropriate length can be used. Even when the pitch (P) is 25 µm or more and 45 µm or less, when the distance (D1) is 6 mm or more and 10 mm or less, the printed wiring board 120 can be inspected with high accuracy.

Modified Embodiments

Figure 5:
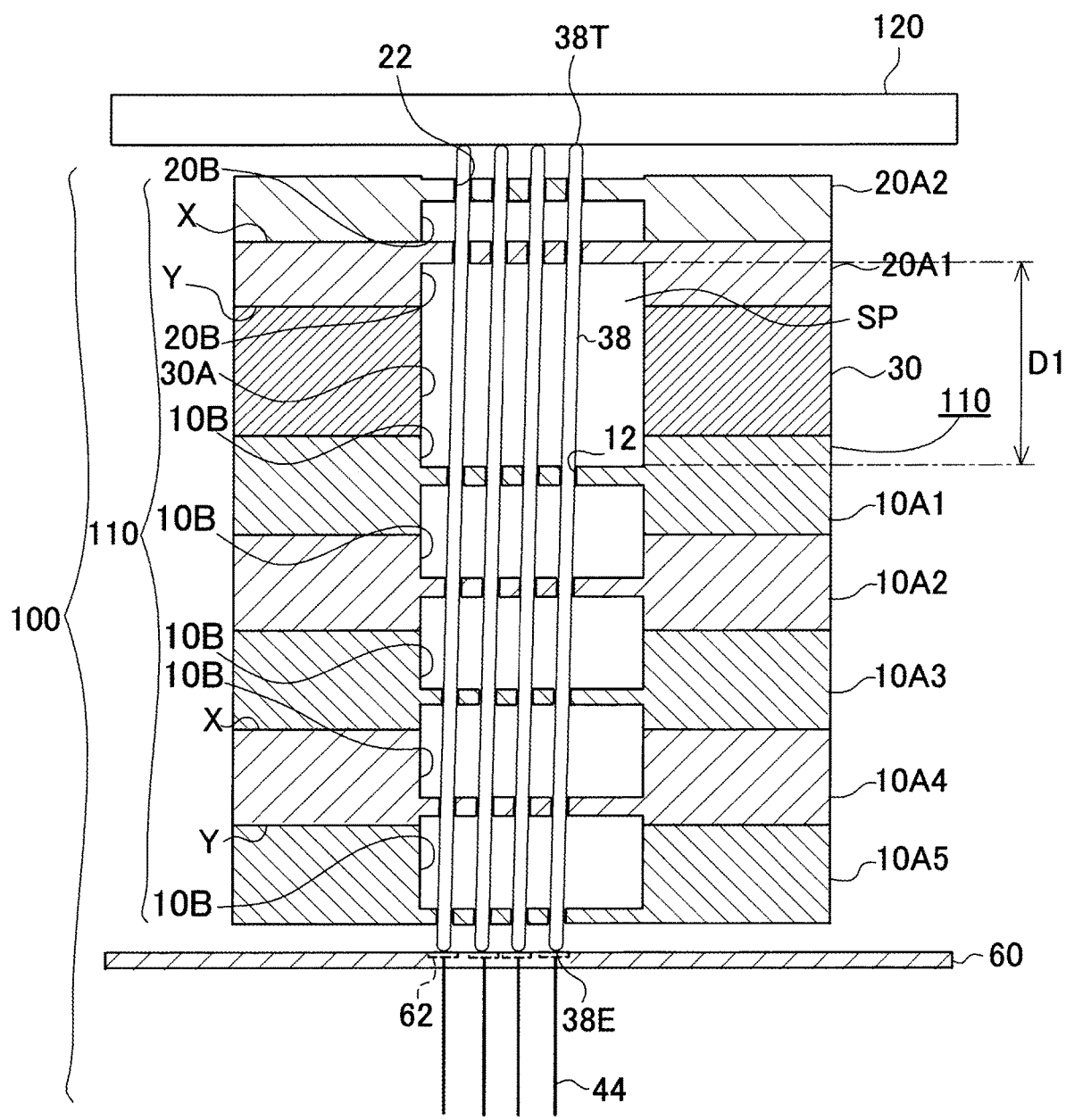
FIG. 5 is a cross-sectional view of a conduction inspection jig according to a modified embodiment of the embodiment.

FIG. 5 is a cross-sectional view of a conduction inspection jig 110 according to a modified embodiment of the embodiment.

The conduction inspection jig 110 of the modified embodiment has multiple first members (10A1, 10A2, 10A3, 10A4, 10A5) and multiple second members (20A1, 20A2).

The first members 10 and the second members 20 each have a first surface (X) and a second surface (Y) on the opposite side with respect to the first surface (X). The first surface (X) is close to the printed wiring board 120 and the second surface (Y) is close to the substrate 60, which has the terminals 62. The first members 10 and the second members 20 can each have a recess recessed from the first surface (X) and a recess recessed from the second surface (Y). By having the recesses on both sides, the distance (D1) of the space (SP) can be accurately adjusted. For example, the distance (D1) is controlled in units in a range of from tens of μm to hundreds of μm. By having the recesses on both sides, the sheets (10b, 20b) can be reduced in thickness. The probes 38 pass through sheets (10b, 20b).

As illustrated in FIG. 2 of Japanese Patent Application Laid-Open Publication No. 2007-309648, the substrate inspection jig of Japanese Patent Application Laid-Open Publication No. 2007-309648 has a contactor, a first holding part, a second holding part, and a supporting post. The supporting post is positioned between the first holding part and the second holding part. Therefore, it is considered that a contact area between the first holding part and the supporting post is small. It is considered that a contact area between the second holding part and the supporting post is small. Then, it is considered that the first holding part and the supporting post are fixed to each other using screws. Similarly, it is considered that the second holding part and the supporting post are fixed to each other using screws. In that case, it is considered that, when the supporting post is short, the screws that fix the first holding part to the supporting post (first holding part screws) interfere with the screws that fix the second holding part to the supporting post (second holding part screws). For example, it is expected that the first holding part screws collide with the second holding part screws. It is considered that it is difficult to shorten the supporting post by using the technology of Japanese Patent Application Laid-Open Publication No. 2007-309648. For example, it is expected that it is difficult to miniaturize the substrate inspection jig by using the technology of Japanese Patent Application Laid-Open Publication No. 2007-309648. A space is formed between the first holding part and the second holding part by the supporting post. Therefore, it is considered that it is difficult to freely determine a distance of the space by using the technology of Japanese Patent Application Laid-Open Publication No. 2007-309648. Further, it is expected that foreign matters enter the space from outside. It is considered that the foreign matters reduce inspection accuracy.

A conduction inspection jig according to an embodiment of the present invention includes: a first member that has multiple first openings; a second member that has multiple second openings and is positioned above the first member; a third member that is positioned between the first member and the second member to form a space between the first member and the second member; and a probe that passes through one of the first openings, the space, and one of the second openings. The third member substantially surrounds the space.

In a conduction inspection jig according to an embodiment of the present invention, the space is formed by the third member positioned between the first member and the second member. And, the third member substantially surrounds the space. Therefore, the third member can be reduced in thickness. The conduction inspection jig can be miniaturized. Cleanliness of the space can be increased. Conduction inspection can be performed with high accuracy.

Obviously, numerous modifications and variations of the present invention are possible in light of the above teachings. It is therefore to be understood that within the scope of the appended claims, the invention may be practiced otherwise than as specifically described herein.

The invention claimed is:

1. A conduction inspection jig, comprising:
a first member having a plurality of first openings;
a second member having a plurality of second openings and configured to be positioned above the first member;
a third member configured to be positioned between the first member and the second member such that the third member forms a single space between the first member and the second member and at least substantially surrounds the single space and has a thickness in a range of 1.5 mm to 10 mm; and
a plurality of probes configured to pass through the plurality of first openings and the plurality of second openings respectively such that the plurality of probes extends through the single space formed between the first member and the second member,
wherein the plurality of probes has a plurality of first ends and a plurality of second ends on an opposite side with respect to the plurality of first ends respectively such that the plurality of first ends is configured to electrically connect to a plurality of electrodes formed at a pitch in a range of 25 μm to 55 μm on a printed wiring board for conduction inspection.

2. The conduction inspection jig according to claim 1, wherein the third member is configured to be positioned between the first member and the second member such that the third member completely surrounds by the single space between the first member and the second member.

3. The conduction inspection jig according to claim 1, wherein the third member has a frame shape.

4. The conduction inspection jig according to claim 1, wherein the third member comprises a plurality of members.

5. The conduction inspection jig according to claim 4, wherein the plurality of members of the third member includes a fourth member and a fifth member.

6. The conduction inspection jig according to claim 5, wherein the fifth member is configured to be laminated on the fourth member such that the fourth member is close to the first member than the fifth member.

7. The conduction inspection jig according to claim 1, wherein the third member has an opening connecting the single space to outside.

8. The conduction inspection jig according to claim 1, wherein the first member has a first recess formed on a second member side and configured to form a part of the single space.

9. A method for inspecting a printed wiring board, comprising:
connecting a printed wiring board to the plurality of probes in the conduction inspection jig of claim 1; and
inspecting the printed wiring board.

10. The conduction inspection jig according to claim 1, further comprising:
a plurality of fixing devices including a first fixing device and a second fixing device such that the first fixing device is fixing the first member to the third member and that the second fixing device is fixing the second member to the third member.

11. The conduction inspection jig according to claim 10, wherein the plurality of fixing devices is formed such that the second fixing device is shifted from a position of the first fixing device.

12. The conduction inspection jig according to claim 10, wherein the first member has a first recess formed on a second member side and configured to form a part of the single space, and the second member has a second recess formed on a first member side and configured to form a part of the single space.

13. The conduction inspection jig according to claim 1, wherein the third member comprises a resin material.

14. A conduction inspection jig, comprising:
a first member having a plurality of first openings;
a second member having a plurality of second openings and configured to be positioned above the first member;
a third member configured to be positioned between the first member and the second member such that the third member forms a space between the first member and the second member and at least substantially surrounds the space and has a thickness in a range of 1.5 mm to 10 mm;
a probe configured to pass through the plurality of first openings and one of the second openings such that the probe extends through the space formed between the first member and the second member; and
a plurality of fixing devices including a first fixing device and a second fixing device such that the first fixing device is fixing the first member to the third member and that the second fixing device is fixing the second member to the third member and shifted from a position of the first fixing device,
wherein the plurality of probes has a plurality of first ends and a plurality of second ends on an opposite side with respect to the plurality of first ends respectively such that the plurality of first ends is configured to electrically connect to a plurality of electrodes formed at a pitch in a range of 25 μm to 55 μm on a printed wiring board for conduction inspection.

15. The conduction inspection jig according to claim 14, wherein the plurality of fixing devices is a plurality of screws such that the first fixing device is a plurality of first screws and that the second fixing device is a plurality of second screws.

16. The conduction inspection jig according to claim 14, wherein the third member is configured to be positioned between the first member and the second member such that the third member completely surrounds by the space between the first member and the second member.

17. The conduction inspection jig according to claim 14, wherein the third member has a frame shape.

18. The conduction inspection jig according to claim 14, wherein the plurality of fixing devices is formed such that a total length of a length of each of the first fixing devices and a length of each of the second fixing devices is greater than a thickness of the third member.

19. The conduction inspection jig according to claim 18, wherein the first member has a first recess formed on a second member side and configured to form a part of the single space, and the second member has a second recess formed on a first member side and configured to form a part of the single space.

20. The conduction inspection jig according to claim 14, wherein the third member comprises a resin material.

\* \* \* \* \*